US006764552B1

(12) United States Patent
Joyce et al.

(10) Patent No.: US 6,764,552 B1
(45) Date of Patent: Jul. 20, 2004

(54) SUPERCRITICAL SOLUTIONS FOR CLEANING PHOTORESIST AND POST-ETCH RESIDUE FROM LOW-K MATERIALS

(75) Inventors: Patrick C. Joyce, Fremont, CA (US); Adrianne Tipton, Fremont, CA (US); Krishnan Shrinivasan, San Jose, CA (US); Dennis W. Hess, Atlanta, GA (US); Satyanarayana Myneni, Atlanta, GA (US); Galit Levitin, Atlanta, GA (US)

(73) Assignee: Novellus Systems, Inc., San Jose, CA (US)

(*) Notice: Subject to any disclaimer, the term of this patent is extended or adjusted under 35 U.S.C. 154(b) by 0 days.

(21) Appl. No.: 10/303,321

(22) Filed: Nov. 21, 2002

Related U.S. Application Data

(63) Continuation-in-part of application No. 10/202,987, filed on Jul. 23, 2002, which is a continuation-in-part of application No. 10/125,614, filed on Apr. 18, 2002.

(51) Int. Cl.[7] .............................. B08B 7/00; B08B 7/04
(52) U.S. Cl. .................................. 134/3; 134/2; 134/26
(58) Field of Search ........................ 134/2, 3, 19, 25.4, 134/26, 28, 29, 30, 34, 35, 36, 41, 902; 510/175

(56) References Cited

U.S. PATENT DOCUMENTS

| | | | |
|---|---|---|---|
| 4,944,837 A | 7/1990 | Nishikawa et al. | 354/299 |
| 5,013,366 A | 5/1991 | Jackson et al. | 134/1 |
| 5,213,619 A | 5/1993 | Jackson et al. | 134/1 |
| 5,215,592 A | 6/1993 | Jackson | 134/1 |
| 5,236,602 A | 8/1993 | Jackson | 210/748 |
| 5,313,965 A | 5/1994 | Palen | 134/61 |
| 5,337,446 A | 8/1994 | Smith et al. | 15/21.1 |
| 5,344,493 A | 9/1994 | Jackson | 134/1 |
| 5,355,901 A | 10/1994 | Mielnik et al. | 134/105 |
| 5,368,171 A | 11/1994 | Jackson | 134/147 |
| 5,370,742 A | 12/1994 | Mitchell et al. | 134/10 |
| 5,377,705 A | 1/1995 | Smith, Jr. et al. | 134/95.3 |
| 5,401,322 A | 3/1995 | Marshall | 134/13 |

(List continued on next page.)

FOREIGN PATENT DOCUMENTS

| | | |
|---|---|---|
| JP | S60-192333 | 9/1985 |
| JP | S64-45131 | 2/1989 |
| JP | H1-44013 | 9/1989 |

OTHER PUBLICATIONS

Constantini et al., "Supercritical Fluid Delivery and Recovery System for Semiconductor Wafer Processing," U.S. Publication No. U.S. 2001/0050096A1, Pub Date: Dec. 13, 2001, 15 Pages.

Chandra et al., "Supercritical Fluid Cleaning Process for Precision Surfaces," U.S. Publication No. U.S. 2002/0014257A1, Pub Date: Feb. 7, 2002, 21 Pages.

*Primary Examiner*—Alexander Markoff
(74) *Attorney, Agent, or Firm*—Beyer Weaver & Thomas, LLP

(57) ABSTRACT

Disclosed formulations of supercritical solutions are useful in wafer cleaning processes. Supercritical solutions of the invention may be categorized by their chemistry, for example, basic, acidic, oxidative, and fluoride chemistries are used. Such solutions may include supercritical carbon dioxide and at least one reagent dissolved therein to facilitate removal of waste material from wafers, particularly for removing photoresist and post-etch residues from low-k materials. This reagent may include an ammonium carbonate or bicarbonate, and combinations of such reagents. The solution may include one or more co-solvents, chelating agents, surfactants, and anti-corrosion agents as well.

25 Claims, 4 Drawing Sheets

U.S. PATENT DOCUMENTS

| | | | | |
|---|---|---|---|---|
| 5,412,958 | A | 5/1995 | Iliff et al. | 68/5 C |
| 5,417,768 | A | 5/1995 | Smith, Jr. et al. | 134/10 |
| 5,482,211 | A | 1/1996 | Chao et al. | 239/135 |
| 5,505,219 | A | 4/1996 | Lansberry et al. | 134/105 |
| 5,509,431 | A | 4/1996 | Smith, Jr. et al. | 134/95.1 |
| 5,514,220 | A | 5/1996 | Wetmore et al. | 134/22.18 |
| 5,522,938 | A | 6/1996 | O'Brien | 134/1 |
| 5,526,834 | A | 6/1996 | Mielnik et al. | 134/105 |
| 5,533,538 | A | 7/1996 | Marshall | 134/104.4 |
| 5,676,705 | A | 10/1997 | Jureller et al. | 8/142 |
| 5,683,473 | A | 11/1997 | Jureller et al. | 8/142 |
| 5,783,082 | A | 7/1998 | DeSimone et al. | 210/634 |
| 5,858,022 | A | 1/1999 | Romack et al. | 8/142 |
| 5,866,005 | A | 2/1999 | DeSimone et al. | 210/634 |
| 5,868,856 | A | 2/1999 | Douglas et al. | 134/2 |
| 5,868,862 | A | 2/1999 | Douglas et al. | 134/26 |
| 5,873,948 | A | 2/1999 | Kim | 134/2 |
| 5,881,577 | A | 3/1999 | Sauer et al. | 68/5 |
| 5,908,510 | A | 6/1999 | McCullough et al. | 134/2 |
| 5,944,996 | A | 8/1999 | DeSimone et al. | 210/634 |
| 5,980,648 | A | 11/1999 | Adler | 134/34 |
| 6,024,801 | A | 2/2000 | Wallace et al. | 134/1 |
| 6,085,762 | A | 7/2000 | Barton | 134/25.4 |
| 6,129,451 | A | 10/2000 | Rosio et al. | 366/173.5 |
| 6,131,421 | A | 10/2000 | Jureller et al. | 68/13 R |
| 6,149,828 | A * | 11/2000 | Vaartstra | 216/57 |
| 6,242,165 | B1 | 6/2001 | Vaartstra | 430/329 |
| 6,306,564 | B1 * | 10/2001 | Mullee | 430/329 |
| 6,537,916 | B2 * | 3/2003 | Mullee et al. | 438/692 |
| 2002/0112740 | A1 * | 8/2002 | DeYoung et al. | 134/3 |
| 2002/0164873 | A1 * | 11/2002 | Masuda et al. | 438/689 |
| 2003/0047195 | A1 * | 3/2003 | DeYoung et al. | 134/12 |
| 2003/0049939 | A1 * | 3/2003 | Worm et al. | 438/745 |
| 2003/0066544 | A1 * | 4/2003 | Jur et al. | 134/10 |

* cited by examiner

SUPERCRITICAL SOLUTIONS FOR CLEANING PHOTORESIST AND POST-ETCH RESIDUE FROM LOW-K MATERIALS

CROSS REFERENCE TO RELATED APPLICATIONS

This application is a continuation-in-part claiming priority under 35 USC §120 from U.S. patent application Ser. No. 10/202,987, filed Jul. 23, 2002, having Patrick C. Joyce et al. as inventors, and titled "Supercritical Solutions for Cleaning Photoresist and Post-Etch Residue from Low-k Materials"; which is in turn a continuation-in-part of U.S. application Ser. No. 10/125,614, having Karen A. Reinhardt et al. as inventors, filed Apr. 18, 2002, and titled "Supercritical Solutions for Cleaning Wafers." Both of these prior documents are incorporated herein by reference for all purposes.

BACKGROUND OF THE INVENTION

Wafer cleaning in modern ULSI semiconductor processing presents numerous engineering dilemmas. At various stages during integrated circuit (IC) fabrication, photoresist, residues, and/or particles must be stripped and/or cleaned from wafers. In the evolution of wafer cleaning, the industry previously employed strong acids, bases, solvents, and oxidizing agents in wet chemical procedures. The wet chemical cleaning agents included sulfuric acid, hydrochloric acid, hydrofluoric acid, ammonium hydroxide, hydrogen peroxide, ozone, N-methylpyrrolidone (NMP), and hydroxylamine (HA). Plasma ashing processes have replaced some wet chemical processes due to lower cost, reduced chemical use, and fewer disposal issues. Under the right physical and chemical conditions, plasmas gently and selectively strip and clean wafers. However, for integrated circuits employing certain new materials such as low-dielectric constant (low-k) insulators, traditional plasma ashing is proving too harsh. The new generation of dielectric materials comprises exotic materials such as porous polymers, which cannot withstand the aggressiveness inherent in plasma ashing. Hence a new generation of cleaning processes is being developed.

Among the methods under development are high-pressure processes that employ "densified" process solutions. Densified fluids are supercritical or near critical solvents such as supercritical carbon dioxide. The materials are often good solvents for contaminants and residues resulting from semiconductor fabrication.

Although supercritical fluids are generating interest as potential wafer cleaning agents, they present their own unique set of engineering challenges. In particular, the cleaning fluid should strongly but selectively solvate or otherwise strip and clean photoresist, residue, contaminant, or whatever else needs to be removed from the wafer. Also, the solvent should not adsorb to the dielectric material, a problem with traditional wet cleans since it causes the k to shift upward. To this end, some researchers have proposed certain additives to increase the solvating power or otherwise improve the cleaning properties of the densified process fluid.

Some researchers have suggested the addition of a surfactant to supercritical carbon dioxide. See, e.g., U.S. Pat. Nos. 5,944,996 and 5,783,082. Other researchers have suggested the use of oxidizing agents such as oxygen. See JP Patent Document No. S64-45131. Still other researchers have proposed specific additive combinations for removing specific contaminants. See, e.g., U.S. Pat. Nos. 5,868,862, 5,868,856, 6,024,801, and 5,866,005.

While these approaches provide steps in the right direction, they are merely preliminary steps. So far the research has failed to provide a systematic analysis of densified solutions and their usefulness in wafer cleaning processes. Therefore, certain advances remain to be discovered in densified solution cleaning technology.

SUMMARY OF THE INVENTION

This invention provides certain formulations of supercritical solutions and their use in wafer cleaning processes. The solutions described in this document may be used to clean many different types of waste from IC fabrication procedures. The waste includes organic and inorganic materials. These materials include photoresists, residues and particles. They may be polymers, metals, organometallics, metal oxides, semiconductors, semiconductor oxides, oxides of dopants, etc.

Particularly preferred embodiments for cleaning photoresist and etch residues from low-k materials are described herein. Such supercritical solutions of the invention may be categorized by their chemistry, for example, basic, acidic, oxidative, and fluorinating chemistries are used. In some embodiments, combinations of these chemistries are used. Supercritical solutions of the invention preferably include supercritical carbon dioxide and at least one reagent dissolved therein to facilitate removal of waste material from wafers, particularly for removing photoresist and post-etch residues from low-k materials. For these embodiments, the reagent preferably includes at least one of a basic ammonium compound (e.g., an ammonium hydroxide, ammonium carbonate, or ammonium bicarbonate), an organic acid, a peroxide source, a fluoride ion source, and combinations of such reagents. As well, the solution may include one or more co-solvents, chelating agents, surfactants, and anti-corrosion agents as well.

One aspect of the invention pertains to methods of removing waste material from a semiconductor wafer. These methods may be characterized as follows: (a) receiving the semiconductor wafer in a chamber; and (b) providing a supercritical solution to the chamber to thereby contact at least one surface of the wafer and remove at least a portion of the waste material from the semiconductor wafer. In these methods, the supercritical solution includes a supercritical solvent with a reagent or reagents dissolved therein to facilitate removal of the material. This reagent may be an ammonium bicarbonate or carbonate, and combinations thereof. Preferably the supercritical solvent is supercritical carbon dioxide, but the invention is not limited in this way.

Also, preferably the supercritical solution may further include a co-solvent that increases the solubility of the reagent (or waste material) in the supercritical solvent. Preferably the co-solvent is selected from the group consisting of alcohols, ethers, alkyl halides, alkanes (straight, branched, or cyclic), alkenes (straight, branched, or cyclic), aromatic compounds, highly fluorinated hydrocarbons (e.g., $C_6F_{14}$), siloxanes, nitriles, amides, and combinations thereof. Depending upon which chemistry i.e. reagents or combinations of reagents are used in a particular supercritical solution, a particular co-solvent or combination of co-solvents may be preferred.

Preferably providing the supercritical solution to the chamber to thereby contact at least one surface of the wafer and remove at least a portion of the waste material from the semiconductor wafer includes adding the reagent, as a solution in the co-solvent, to the supercritical solvent in the presence of the semiconductor wafer.

Ammonium bicarbonates and carbonates of the invention are preferably tetraalkyl ammonium compounds, but the invention is not limited in this way. A particularly preferred ammonium bicarbonate is tetramethyl ammonium bicarbonate, which is particularly soluble in carbon dioxide. Particularly preferred methods using these reagents and combinations thereof, are de scribed below more fully in the detailed description.

In some preferred embodiments, methods of the invention further include rinsing the semiconductor wafer with at least one of deionized water, an organic solvent, the supercritical solvent, and mixtures thereof after providing the supercritical solution to the chamber to thereby contact at least one surface of the wafer and remove at least a portion of the waste material from the semiconductor wafer.

In many preferred embodiments, the supercritical solution also includes a chelating agent that complexes metal ions contained in the waste material to be removed from the wafer. Generally, any conventional chelating agent used to chelate metal ions in inorganic chemistry may be used. Specific examples of chelating agents suitable for use in this invention include β-diketones, ethers (e.g., crown ethers), phenols (including catechols and sterically hindered phenols such as gallic acid), EDTA (ethylene diamine tetraacetic acid), etc. The chosen chelating agent should not react with the supercritical solvent, the co-solvent, or other reagents used in the supercritical solution.

To protect against corrosion of exposed metal surfaces on the wafer (during wafer transport or storage for example), the supercritical solution may include an anti-corrosion agent. Many chelating agents will also serve as anti-corrosion agents. However, the agent must strongly adhere to the metal's surface. Not all chelating agents meet this requirement. Often anti-corrosion agents will possess bulky side-groups and provide steric hindrance. Examples of suitable anti-corrosion agents include ortho- and meta-dihydroxybenzenes such as catechol, gallic acid, oxalic acid, thiophenes, thiols, glymes, etc.

Finally, the supercritical solution may include a surfactant that assists in removal of particles from the at least one surface of the wafer. Examples of suitable surfactants for this purpose include amphiphilic fluoropolymers and siloxanes, poly carbonates and carbonate copolymers.

The detailed description below will further discuss the benefits and features of this invention.

DETAILED DESCRIPTION OF THE INVENTION

Introduction

This application pertains to methods of cleaning substrates with supercritical cleaning solutions. In many embodiments, the substrate of interest is a wafer. As used herein, the term "wafer" generally refers to a semiconductor wafer as such wafer exists during any of many stages of integrated circuit fabrication thereon.

Numerous integrated circuit fabrication processes generate waste material which must be removed from the wafer before subsequent process steps. These processes include post-photolithography, etching, implanting, planarization (e.g., chemical mechanical polishing), etc. In many processes, the resulting waste products are polymeric materials such as photoresists, and the residue or "crust" resulting from post-etch and post-implant steps. The photoresists may be either a positive or a negative photoresist of various compositions. For example, the photoresist may be a novolac resin (poly(4-hydroxy 2-methylstyrene) or poly(4-vinyl 3-methylphenol)), poly-hydroxylstyrene, poly-methylmethacrylate, in some cases siloxanes, poly-norbornanes, and the like. In other processes, the waste products are metal residues, particles, highly-carbonized residues, fluorocarbon based residues, polishing residues, and the like. Examples of metals commonly encountered in integrated circuit fabrication include copper, aluminum, titanium, tungsten, and their oxides and nitrides. Other residue materials that may be encountered include silicon, silicon dioxide, and various silicides. Any of these may be cleaned using supercritical solutions in accordance with this invention.

The present invention provides supercritical cleaning solutions and methods of using such solutions to remove some or all of the waste products generated by the various integrated circuit processing operations. In one embodiment, supercritical cleaning solutions of similar compositions are used at various stages during the course of an integrated circuit fabrication sequence to remove various types of waste. One example of a suitable apparatus for conducting such cleaning operations is depicted below in FIG. 2A. In another embodiment, the cleaning solution attacks different types of waste so that the wafer surface can be completely cleaned in a single operation.

In some cleaning operations, a supercritical solution such as one of those described below cleans both photoresist and residue from a wafer surface after photolithography and etching or implant. In later operations, a cleaning solution of the same composition (or a similar composition) may be employed to clean sputtered metal from the surface of a semiconductor wafer. Other particles may be cleaned by the same or similar solutions in even later process steps. Of course, solutions used in different steps may also be very different.

Figure 1:
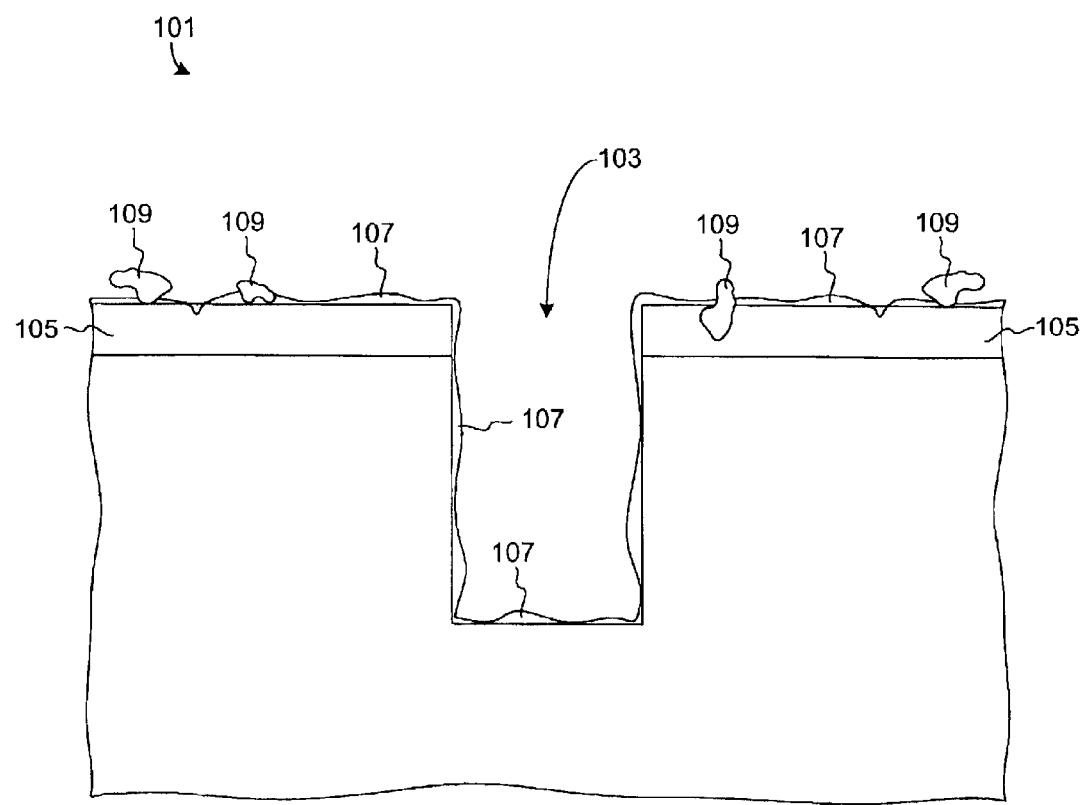
FIG. 1 is a schematic illustration of a partially fabricated integrated circuit structure after etching and including various waste materials that must be removed.

To provide a rough illustration of the condition of a wafer surface after a typical etching step, FIG. 1 is provided. As shown there, a partially fabricated integrated circuit surface 101 includes an etched recess 103. Recess 103 was previously defined by a pattern in a layer of photoresist 105. Note that photoresist layer 105 remains on the wafer surface after the etching operation is complete. It must be removed prior to subsequent processing.

A thin irregular layer of residue 107 adheres to the walls of recess 103 as well as the field regions outside the recess. Some of the residue may penetrate into the polymer matrix of photoresist 105. In addition to the residue, various particles 109 (typically of submicron size) are distributed over the wafer surface. These particles are composed of etched metal or other material generated in the process. Like the residue, they may be embedded in the polymer matrix. In accordance with this invention, a processing operation employs a single supercritical cleaning solution (comprised of various components) to remove the particles 109, the residue 107, and the photoresist 105. The various components employed in the cleaning solution attack different types of waste so that the wafer surface can be completely cleaned in a single operation. Even the residue embedded in the photoresist can be removed in a single operation.

Supercritical Solution Composition

As indicated, this invention pertains to the use of supercritical solutions for cleaning substrates. Supercritical fluids exist when the temperature and pressure of the fluid are above the critical temperature and pressure for that fluid. For example, the critical temperature and pressure for carbon dioxide are 31.0° C. and 73.9 bar (1070 psig). In the supercritical state, there is no differentiation between the liquid and gas phases and the fluid can be viewed as a dense fluid in which the saturated vapor and saturated liquid states are identical. Fluids or solutions are considered to be near critical when the temperature and pressure of a solution are both greater 80% of their critical point, but the solution is not yet in the supercritical phase. Due to their high density, supercritical and near critical fluids possess superior solvating properties compared to gases. In this application, when a fluid is referred to as "supercritical" it is understood to cover both supercritical and near critical conditions.

In the context of this invention, the supercritical fluids are solutions including both a solvent and one or more solutes. The solute may be a reagent, a reactant, another solvent, or other material useful in cleaning the wafer. In some embodiments, the supercritical solution contains a primary solvent and one or more co-solvents.

While the description presented herein focuses on carbon dioxide as a primary solvent, other condensable gases in the supercritical state could be substituted for carbon dioxide. Examples of such gases include carbon monoxide (CO), nitrous oxide ($N_2O$), xenon, hydrogen sulfide, ethanethiol, alkanes (from C1–C7, linear, branched, and ring structures; hexane for example), alkenes (e.g. ethylene and propylene), aromatics (toluene, benzene, and xylene), alcohols (C1–C5, linear and branched), acetone, hexafluoroacetone, alkyl amines (e.g., methyl amine, dimethyl amine, trimethyl amine, and ethyl amine), sulfur hexafluoride, ammonia, water, and chloro, fluoro, and freon short-chain molecules (e.g., $C_2F_6$, $CHClF_2$, $CCl_4$, $CF_4$, $CHF_3$). If a supercritical fluid other than supercritical carbon dioxide is employed, then some of the specific chemical components may vary slightly from those listed below. The process conditions (temperature, pressure, etc.) may also vary dramatically depending on the choice of supercritical fluid. But in general, the composition will include one or more of a reagent, a co-solvent, a chelating agent, an anti-corrosive, and a surfactant. These components will be chosen to be compatible with the supercritical solvent.

A wide range of solutes and other additives may be provided with the supercritical solvent to augment the cleaning capability of the supercritical cleaning solution. These additives may be divided into various classes. One important class is the co-solvent class. Co-solvents are used to increase the solubility of the material to be removed (photoresist, residue, etc.) and/or other additives that make up the cleaning solution together with the supercritical carbon dioxide. Reagents are another class of additives that may be provided with the supercritical carbon dioxide. Examples of reagents include swelling agents that physically break apart polymeric materials, chemical reactants that break chemical bonds of polymeric materials, and solvents specifically chosen to dissolve particular polymers remaining on the wafer surface. Chelating agents are another class of additives that may be provided in the supercritical cleaning solutions of this invention. Such chelating agents are chosen to complex with metal ions and atoms to allow dissolution of the metal in the supercritical carbon dioxide solution. Anticorrosion agents or corrosion inhibitors are yet another class of additives that may be employed in the solutions of this invention. These reagents are used to prevent uncontrolled oxidation of metal surfaces, particularly during exposure of the wafer to the ambient atmosphere. In some embodiments, the corrosion inhibitors may be the same molecules as the chelating agents. Surfactants represent still another class of additives that may be employed in the solutions of the present invention. Surfactants may also be employed to form micelles that facilitate particle removal and prevent redeposition on the surface.

The supercritical solutions of this invention can include any one or more of the above-described components, chosen to meet the goals of the cleaning process. Preferably, it will include at least a dissolved reagent of a specific type; e.g., ammonium hydroxides, carbonates, and/or bicarbonates, fluoride sources, an organic acid, a peroxide source, and combinations thereof. Other preferred embodiments provide both a reagent and a chelating agent in the supercritical solution. Still other preferred embodiments provide both reagent and surfactant in the supercritical solution. Other preferred combinations include (1) co-solvent, reagent, and chelating agent, (2) co-solvent, reagent, and surfactant, (3) co-solvent, chelating agent, and surfactant, (4) reagent, chelating agent, and surfactant, (5) reagent and anticorrosion agent, and (6) co-solvent, reagent, chelating agent, and surfactant. Regardless, the solution composition is chosen to have wide applicability across multiple types of cleaning operations.

The general criteria for any additive include the following. First, the additive should be soluble in the supercritical solvent to an appreciable extent. For most additives, the solubility should be at least about 0.1% by weight to impart significant functionality. Second, the additive should not react with the supercritical solvent, for example, to produce an insoluble product. Thus, for example, primary and secondary amines usually are not acceptable additives when supercritical carbon dioxide is the solvent. Finally, the additives should be chosen so that they should not cross-react or otherwise detrimentally interact with one another. In certain situations, some limited cross-reaction may be beneficial. For example, it may be possible and beneficial to generate carbonic acid ($H_2CO_3$) on the wafer surface from the interaction of water and carbon dioxide solvent.

Co-solvents

Co-solvents improve the solubilizing properties of the primary solvent (e.g., supercritical carbon dioxide). Some co-solvents increase the solubility of the waste product to be removed. Alternatively, or in addition, the co-solvent may increase the solubility of other additives in the supercritical solution. In a particularly preferred embodiment, the co-solvent is chosen to help dissolve and/or swell a polymer. Regardless of the specific function, the co-solvent should improve the miscibility of a component and/or a waste product in the primary supercritical fluid.

Supercritical carbon dioxide is itself a moderate solvent for many polymers. The literature reports that for some polymers, solubility can vary between about 1% and 7% by weight in supercritical carbon dioxide. The interaction between the polymer and the swelling agent; and/or the polymer, the swelling agent, and supercritical carbon dioxide, causes the swelling that helps remove polymeric waste product. A "solution" forms of the swelling agent in the polymer. The supercritical carbon dioxide itself acts as a swelling agent. Carbon dioxide can diffuse into the polymeric matrix and "dissolve" the polymer. Physical aspects of swelling using supercritical carbon dioxide also are apparent. As supercritical carbon dioxide is "dissolved" in the polymer matrix, rapid depressurization causes the polymer to break apart. The physical structure, molecular weight, and density of the polymer also play a role in the swelling mechanism.

One general class of co-solvents is the polar solvents. These help to dissolve polar reagents such as certain oxidizing agents. They may also swell certain polar polymeric materials, including many photoresists. Examples include alcohols (including, e.g., perfluoroalcohols), alkyl halides (e.g. 1,2-dichoroethane (DCE), dichoromethane (DCM), and choroform ($CHCl_3$)), ethers, esters (e.g., propylene carbonate), phenols (including the cresols), certain siloxanes (e.g., $-Si(CH_3)_2-O-Si(CH_3)_3$), aldehydes (including formaldehyde and acetyaldehyde), ketones (e.g. acetone or methyl ethyl ketone (MEK), nitrites (e.g. acetonitrile), amides (e.g. DMF or NMP), and the like. Alcohols such as ethanol have been found to be useful polar co-solvents. Examples include methanol, ethanol, 1-propanol, 2-propanol, butanols, trifluoroethanol, and heptafluorobutanol. Water can be a co-solvent (or a reactant) depending on how it is used. Examples of suitable ether co-solvents include glymes such as glyme and diglyme. Generally, co-solvents having fluorinated alkane groups or siloxane or fluorinated siloxane groups have increased solubility—in comparison to related compounds without such groups.

Another general class of co-solvents is the non-polar solvents. These include, for example, hydrocarbons such as alkanes (straight, branched, or cyclic) alkenes (straight, branched, or cyclic), aromatic compounds such as toluene, benzene, xylene, etc., highly fluorinated hydrocarbons (e.g., $C_6F_{14}$), alkyl halides like carbon tetrachloride, and the like. Hexane and cyclohexane are known to be useful non-polar co-solvents.

The concentration of co-solvent in the primary supercritical solvent is typically limited by solubility. Preferred ranges typically exist up to about 20% by weight, more preferably between about 0.5 and 10% by weight. Obviously, the actual concentration chosen will depend upon what materials are to be solvated.

Reagents

In the context of this invention, "reagents" are directly responsible for removing polymer or other waste materials from the wafer surface. Reagents for removing polymers generally fall into one or more classes based on mechanism of action: (1) agents that separate or break apart polymers or other residues by physical action, and (2) reactants that break down polymers or other residues by breaking chemical bonds.

Within the first class of agents are "swelling" agents. Generally, swelling agents will have a chemical affinity for the moieties of the polymer to be removed. For example, if a photoresist is perfluorinated, then a swelling reagent having $-CF_2$-moieties will often be useful. These agents interact with the polymer photoresist or other residue and may cause it to increase in volume to a point where it physically breaks apart from the underlying substrate and can be more easily swept away by flowing solution or dissolved.

Note that some co-solvents may also qualify as swelling agents. However, while co-solvent swelling agents act primarily by their miscibility with polymer residues, reagent swelling agents may act by different mechanisms. The reagent swelling agents facilitate swelling by helping to break apart the polymer and/or dislodge it from the underlying wafer substrate. They may accomplish this by breaking covalent bonds, disrupting electrostatic attraction between polymer and substrate, or other related mechanisms.

Examples of useful reagent swelling agents include almost all tertiary amines. Specific examples include N-methyl pyrrolidinone (NMP), dimethylformamide (DMF), dimethylethanolamine, methyldiethanolamine, triethanolamine, and pyridine. Note that tertiary amines tend to break bonds in polymeric photoresists and thereby promote some degree of swelling.

Glycols and polyethers also facilitate swelling of polymers. Examples of suitable glycols include the simpler glycols such as ethylene glycol. Examples of suitable polyethers include glyme, diglyme, diethyleneglycol, diethylether, and carbitols.

Still further, many fluorinated compounds and salts can act as useful swelling reagents. Examples include perfluoroacetamide, ammonium fluoride, t-butyl ammonium fluoride, and other ammonium fluorides such as n-propyl, isopropyl, and n-butyl ammonium fluorides. These may also act to break chemical bonds.

Still other swelling reagents include acetone and acetonitrile. Note that these two compounds, as well as some others such as DMF, can act as both co-solvents and "swelling-type" reagents.

Reactant type reagents (the second reagent type identified above) break chemical bonds. These agents may completely degrade the polymer to effect removal. Alternatively, they may modify or weaken the polymer to render it more soluble in the supercritical solution. The reactant may attack the bonds of the polymer itself or the bonds between the polymer and the substrate. If it attacks the bonds of the polymer itself, it may serve to de-polymerize the material.

Of the reagents that break chemical bonds,1 many act as reactant reagents in typical chemical reactions. These reagents are consumed during the cleaning process. Examples of such reagents include oxidizing agents such as peracids and peroxides. Specific examples of peracids include peracetic acid and meta-chloroperbenzoic acid. Specific examples of peroxides include hydrogen peroxide, adducts such as urea hydroperoxide, and organic peroxides, such as benzoyl peroxide, and particularly dialkyl peroxides such as di-tertiary butyl peroxide.

In addition, the reagents may be basic substances that attack electropositive moieties or bonds in the residue. Hydroxides, carbonates, and bicarbonates can all be sufficiently basic and used as reagents in compositions of this invention. Preferred classes of basic reagent include ammonium hydroxides, ammonium bicarbonates, and ammonium carbonates. In many embodiments, the ammonium cation contains one or more organic groups such as alkyl groups. Tetraalkyl ammonium compounds are particularly preferred. Examples include tetramethyl, tetrabutyl, and tetrapentyl ammonium compounds. Other alkyl groups such as fluoroalkanes, perfluoroethers, polycarbonates and polyethers are also within the scope of this invention and may also increase the solubility of bicarbonate and carbonate salts. Note that other ammonium compounds of this invention may employ alternative anions such as chloride and nitrate—but these compounds will be less basic.

Another reactant category is the catalytic reagent. These are agents that catalyze the breakdown, dissolution, or other degradation reaction of a waste product. Some catalytic reagents act by facilitating generation of radicals. This allows a variety of reactions to take place more rapidly. In one example, the reagent catalyzes abstraction of a certain atom from a molecule; e.g., removing a fluorine atom and replacing it with a hydrogen atom. Within the definition of "reagent" are compounds that directly attack inorganic, non-polymer waste materials. One example of a reactant reagent that attacks a non-polymer waste is hydrogen fluoride, which attacks oxides. In another example, hydroxylamine compounds reduce metal oxides to liberate free metal ions, which can be scavenged with a chelating agent.

Other suitable reagents acting by one or more of the above mechanisms of action include acetic acid, DMSO, THF, water, and propylene carbonate. Again, to these compounds may, in some cases, have a dual function within a supercritical cleaning solution: reagent and co-solvent.

The concentration of the reagent in the primary supercritical solvent is typically limited by solubility. The concentration of reagent in the supercritical solvent preferably ranges between about 0.1 and 15% by weight, more preferably between about 0.5 and 10% by weight. The actual concentration will be a function of the reaction in which the reagent participates.

Chelating Agents

Chelating agents bond with metal ions to produce a complex that is soluble in the supercritical cleaning solution. This makes the metal ion soluble at a higher concentration than would be otherwise possible without the chelating agent. Chelating agents with high solubility in supercritical carbon dioxide (or other supercritical primary solvent) are preferred. Generally, traditional chelating agents for organic chemistry can be used with supercritical carbon dioxide. The chelating agents may be targeted to alkali metal ions, alkaline earth metal ions, transition metal ions, etc. as the case may be. In the residues and particles generated during integrated circuit fabrication processes, one commonly encounters the following metals, all of which may be chelated: tungsten, copper, sodium, titanium, tantalum, cobalt, iron, chromium, etc.

Chemical classes of chelating agents include β-diketones, ethers (e.g., crown ethers), phenols (including catechols and sterically hindered phenols such as gallic acid), certain alcohols, and fluorinated versions (typically perfluorinated) of any of these, as well as tertiary diamines. Specific examples of chelating agents include acetylacetone, catechol, EDTA, hfac (hexafluoroacetylacetone) and biphenol, dithiolcarbamate. Generally, these agents are effective at chelating ions of alkali metals, alkaline earth metals, transition metals, and main group metals. Many are especially useful in chelating copper ions.

The concentration of the chelating agent in the primary supercritical solvent is typically limited by solubility. Preferably, the concentration ranges up to about 15% by weight, more preferably between about 0.1 and 2% by weight. The actual concentration depends upon such factors as the solubility of the chelating agent in the solution and the concentration of metal ions to be removed from the wafer. A typical chelating agent concentration is two to three times in excess of the maximum chelation ratio (This is dependent on the metal that is to be chelated, and how many binding sites a chelating agent will consume, it can be in ~3× excess of that ratio, i.e. copper will bind two molecules of acetyl acetone, so the ratio should be about 5:1 acac to Cu).

Anticorrosion Agents

In certain regards, these overlap with the chlelating agents, although they have a different goal. Anticorrosion agents are added to prevent uncontrolled oxidation of an exposed metal surface. Sometimes this protection is referred to as passivation. Damaging oxidation could otherwise occur when wafers are removed from processing apparatus and stored or moved through the ambient atmosphere.

Unlike chelating agents, anticorrosion agents must adsorb to or otherwise adhere to the substrate metal surface. Still they must have an affinity for metal in order to provide protection from oxidation. Preferably, they easily release from the metal surface upon heating, evacuation, or other preferably benign stimulus.

Suitable anticorrosion agents are often compounds with sterically hindered sites. Ortho- and meta-dihydroxybenzenes such as catechol arc examples. Other examples include gallic acid, thiophene, thiols, glymes, glycols, and derivatives of these.

The concentration of the anticorrosion agent in the primary supercritical solvent is typically limited by solubility. Preferably, the concentration ranges up to about 5% by weight, more preferably between about 0.1 and 2% by weight. The concentration should be sufficient to ensure that the exposed metal surfaces are passivated.

Surfactants

Surfactants may be provided to remove particles from substrate/wafer surfaces and prevent redeposition of such particles. For purposes of this invention, particles are debris of diameter about 0.5 micrometers or smaller. The particle size range that is detrimental to device performance decreases as the integrated circuit line widths decrease.

In supercritical carbon dioxide, surfactants may form reverse micelles, having a $CO_2$-philic tail portion and a water-philic head portion. Note that small amounts of water or other comparable polar molecule may be present in the cores of these types of micelles. In some embodiments, water may be present at relatively high concentrations; e.g., up to about 70% by weight. Note that water is not necessarily required. Any polar molecule may allow formation of a micelle emulsion. And in other cases, the surfactant heads themselves align to form the micelle core.

Surfactants can be anionic, cationic, or neutral. Classes of surfactant include acids, amines, and the like. Specific examples of $CO_2$-philic groups for the surfactants include siloxane groups, carbonate groups and fluorinated organic groups.

The concentration of surfactant may be limited by solubility. Preferably, the concentration of surfactant in the supercritical solvent ranges up to about 50% by weight, more preferably between about 0.1 and 30% by weight. Obviously, the actual concentration chosen will depend upon the size and chemical composition of the particles to be removed. As mentioned, water may be present in solution with the surfactant.

Methods of Cleaning Semiconductor Wafers

As indicated above, the processes of this invention may be employed to clean a partially fabricated semiconductor wafer after many of the various fabrication steps. These may be front-end steps employed to form circuit elements on the underlying single crystal semiconductor substrate or back-end steps employed to produce the wiring between the circuit elements created during front-end processing. Cleaning may be performed before, during, or after any of the unit operations of integrated circuit fabrication. These operations include, for example, etching, implantation, deposition, and oxidation. After ion implantation, the supercritical cleaning solution may remove photoresist and certain residues such as arsenic oxide, phosphorus oxide, is silicon oxide, and/or boron oxide. After etching, the cleaning solution may remove photoresist and whatever material has been etched away (metals, metal oxides, dielectrics, fluorocarbons, and the like). Cleaning may also be performed prior to deposition or after planarization (e.g., chemical mechanical polishing). To this end, the cleaning solution may remove oxides and/or provide and anticorrosion barrier on exposed metal surfaces.

Thus this invention provides a holistic approach applicable to clean multiple types of integrated circuit fabrication waste products. Stated another way, the invention may employ the same or a similar supercritical cleaning solution across multiple process steps. An example of one sequence is as follows: (1) perform photolithography and etching or implanting; (2) remove photoresist, residue, and particles with a supercritical cleaning solution; (3) sputter or otherwise deposit and overlayer and optionally planarize; (4) using a similar supercritical cleaning solution remove particles and/or residue remaining from deposition and/or planarization steps.

Also, as indicated, the cleaning solutions chosen for use with this invention clean multiple types of waste products from a wafer surface in a single operation—without the need for multiple cleaning solutions or cleaning steps. For example, after etching, a wafer may be cleaned with a supercritical cleaning solution that removes metal and non-metal particles, etch residues and photoresist—all in a single step.

The methods described below are particularly useful for cleaning contaminants from low-k materials. As mentioned, in methods of this invention, preferably the supercritical cleaning solution includes supercritical carbon dioxide together with a reagent of the types described above. Preferably, the reagent is a basic ammonium compound (e.g., an ammonium hydroxide, carbonate, or bicarbonate), a fluoride source, an organic acid, a peroxide source, and combinations thereof.

In methods of the invention, preferably the pressure within the chamber is between about 1500 and 5000 psi during exposure of the wafer to the supercritical solution. Preferably the temperature within the chamber is maintained at between about 50° C. and 150° C. Preferably the contact with at least one surface of the wafer is maintained for a period of between about 1 and 60 minutes. More specific conditions, which fall within the above parameters, for methods of the invention are described below in relation to particular chemistries. After treatment of the wafer with the supercritical solution, preferably methods of the invention further include rinsing the semiconductor wafer with at least one of deionized water, an organic solvent, the supercritical solvent, and mixtures thereof.

The supercritical solutions used with the present invention may be prepared by many different suitable procedures. Some portion or all of the composition may be prepared in a subcritical state or, alternatively, in a supercritical state. Further, additives can be provided to the solution ahead of time (prior to cleaning) or later during the actual cleaning operations. And some additives may be converted from a precursor to an active state by introduction to the process system (in situ preparation). Some of the various options are discussed in U.S. patent application Ser. No. 10/067,520, filed on Feb. 5, 2002 by K. Shrinivasan et al., and titled, "Apparatus and Methods for Processing Semiconductor Substrates Using Supercritical Fluids." That patent document is incorporated herein by reference for all purposes. See also the discussion of apparatus presented below.

Considering the example of an ammonium bicarbonate, it may be prepared in situ, in one example, by contacting an ammonium hydroxide precursor (e.g., tetramethyl ammonium hydroxide) with carbon dioxide from the process fluid. Some amount of the carbon dioxide reacts with the hydroxide to form the bicarbonate. The carbon dioxide may be subcritical or supercritical and the contacting may be performed in the process vessel or in a line or chamber outside the process vessel. In a typical case, the carbon dioxide is bubbled or otherwise passed through a solution of tetramethyl ammonium hydroxide (e.g., a methanol solution). The resulting tetramethyl ammonium bicarbonate solution is directly combined with the carbon dioxide and any other appropriate components to form the supercritical cleaning solution. Note that the carbon dioxide contacting the tetramethyl ammonium hydroxide may contain all the other necessary components of the supercritical cleaning solution (e.g., chelating agents, co-solvents, etc.). Alternatively, the precursor is provided in a solution of a co-solvent for the final cleaning solution. Aliphatic alcohols are preferred co-solvents for this application.

In an alternative example, the tetramethyl ammonium bicarbonate is prepared ahead of time and then introduced to the process fluid via an ampoule or other suitable mechanism. Preferably the bicarbonate is provided in a solution containing a co-solvent for the cleaning solution (e.g., a methanol solution).

EXAMPLES

In one preferred method, the supercritical cleaning solution includes supercritical carbon dioxide with an ammonium hydroxide, preferably a tetraalkyl ammonium hydroxide such as tetrabutyl ammonium hydroxide. An exemplary co-solvent used in such methods is an aliphatic alcohol. For example, a solution of tetrabutyl ammonium hydroxide is prepared in ethanol. Then the solution is added to the supercritical carbon dioxide in the presence of the wafer (in a cleaning chamber) to make the supercritical solution. Preferably the ammonium hydroxide has a final concentration in the supercritical solution of between about 0.1 and 0.5% by weight. Preferably the temperature within the chamber is maintained at between about 50° C. and 150° C., more preferably about 70° C. Preferably the contact with at least one surface of the wafer is maintained for a period of between about 1 and 60 minutes, more preferably between about 5 and 20 minutes.

A related cleaning solution may be prepared from a tetraalkyl ammonium bicarbonate (e.g., tetramethyl ammonium bicarbonate). In this solution, the solvent is supercritical carbon dioxide and an aliphatic alcohol is used as a co-solvent. The bicarbonate mixture used is ~15 wt % in the $SCCO_2$. The $CO_2$ is 84.88 mole percent, 85.23 weight percent, methanol 13.53 mole percent and 9.88 weight percent and TMA bicarbonate is 1.59 mole percent and 4.89 weight percent.

In some embodiments, the supercritical solution further includes a chelating agent. For methods of the invention employing ammonium hydroxides (or bicarbonates or carbonates), preferably the chelating agent is selected from the group consisting of EDTA, acetyl acetone, hexafluoro-acetyl acetone, catechol, biphenol, and dithiolcarbamate. In some embodiments, the supercritical solution further includes an anti-corrosion agent. For methods of the invention employing ammonium hydroxides (or bicarbonates or carbonates), preferably the anti-corrosion agent is selected from the group consisting of thiophenes and thiols. In some embodiments, the supercritical solution further includes a surfactant that assists in removal of particles from at least one surface of the wafer. Examples of suitable surfactants for this purpose include amphiphilic fluoropolymers and siloxanes, poly carbonates and carbonate copolymers.

In another preferred method, the supercritical cleaning solution includes supercritical carbon dioxide with a fluoride source. Preferably the fluoride source is chosen from the group consisting of hydrogen fluoride, Selectfluor, an ammonium fluoride, a tetrafluoroborate salt, a dialkylamino sulfur trifluoride, and combinations thereof. Exemplary co-solvents used in such methods are ethers and nitrites. For example, a solution of tetrabutyl ammonium fluoride is prepared in THF (tetrahydrofuran). Then the solution is added to the supercritical carbon dioxide in the presence of the wafer (in a cleaning chamber) to make the supercritical solution. In another example, a solution of Selectfluor™ (1-fluoro-4-methyl-1,4-diazoniabicyclo[2.2.2]octane bis (tetrafluoroborate)) (available from Air Products and Chemicals, Inc. Allentown, Pa.) is prepared in acetonitrile. Preferably the co-solvent comprises between about 2 and 10 percent by weight of the supercritical solution. Preferably the fluoride source has a final concentration in the supercritical solution of between about 0.1 and 2% by weight. Preferably the temperature within the chamber is maintained at between about 50° C. and 150° C., more preferably about 70° C. Preferably the contact with at least one surface of the wafer is maintained for a period of between about 1 and 60 minutes, more preferably between about 5 and 20 minutes.

As indicated, the supercritical solution may include a chelating agent. For methods of the invention employing fluoride sources, preferably the chelating agent is selected from the group consisting of EDTA, acetyl acetone, hexafluoroacetyl acetone, catechol, biphenol, and dithiolcarbamate. In some embodiments, the supercritical solution further includes an anti-corrosion agent. For methods of the invention employing fluoride sources, preferably the anti-corrosion agent is selected from the group consisting of thiols, thiophenes, gallic acid, and the like. In some embodiments, the supercritical solution further includes a surfactant that assists in removal of particles from the at least one surface of the wafer. Examples of suitable surfactants for this purpose include amphiphilic fluoropolymers and siloxanes, poly carbonates and carbonate copolymers.

In yet another particularly preferred method, the supercritical cleaning solution includes supercritical carbon dioxide with an organic acid. Preferably the organic acid is chosen from the group consisting of formic acid, acetic acid, propionic acid, butanoic acid, oxalic acid, benzoic acid, succinic acid, trifluoroacetic acid, and mixtures thereof. Exemplary co-solvents used in such methods are alcohols, ethers, alkyl halides, and nitrites. In some preferred embodiments, only the organic acid is used with the supercritical solvent. It may act as a reagent (to dissolve acid labile polymer or residues for example) and a co-solvent. For example, acetic acid is added to supercritical carbon dioxide to make the supercritical solution. In some embodiments, a co-solvent such as acetonitrile is used with for example acetic acid to form the supercritical solution with carbon dioxide. A particularly preferred combination of acids is acetic acid and oxalic acid. Preferably the concentration of the organic acid (or acids) comprises between about 1 and 20 percent by weight of the supercritical solution, more preferably between about 2 and 10 percent, even more preferably about 5 percent. Preferably the temperature within the chamber is maintained at between about 50° C. and 150° C., more preferably about 70° C. Preferably the contact with at least one surface of the wafer is maintained for a period of between about 1 and 60 minutes, more preferably between about 5 and 20 minutes.

For methods of the invention employing organic acids, preferably the chelating agent is selected from the group consisting of acetyl acetone, gallic acid, oxalic acid, EDTA, hexafluoroacetyl acetone, catechol, biphenol, dithiolcarbamate. In some embodiments, the supercritical solution further includes an anti-corrosion agent. For methods of the invention employing organic acids, preferably the anti-corrosion agent is selected from the group consisting of thiophenes, thiols, and gallic acid. In some embodiments, the supercritical solution further includes a surfactant that assists in removal of particles from the at least one surface of the wafer. Examples of suitable surfactants for this purpose include amphiphilic fluoropolymers and siloxanes, poly carbonates and carbonate copolymers.

In still yet another particularly preferred method, the supercritical cleaning solution includes supercritical carbon dioxide with a peroxide source. Preferably the peroxide source is chosen from the group consisting of hydrogen peroxide and an organic peroxide. Exemplary co-solvents for use with peroxide sources are alcohols, acids, water, nitrites. In some preferred embodiments, due to their increases solubility in organic solvents, relative to hydrogen peroxide, only the organic peroxide is used with the supercritical solvent. In other examples, co-solvent are used with the organic peroxides. Preferably the peroxide source has a final concentration of between about 0.1 and 1% by weight in the supercritical solution.

In one particularly preferred embodiment, hydrogen peroxide (in water) is added to a co-solvent (for example acetonitrile) and the solution added to supercritical carbon dioxide to form the supercritical solution. In this example, preferably the temperature within the chamber is maintained at between about 100° C. and 150° C., more preferably about 120° C. In another example, a solution of m-CPBA in an alcohol (e.g. ethanol) is added to supercritical carbon dioxide to make the supercritical solution. In this example, preferably the temperature within the chamber is maintained at between about 50° C. and 100° C., more preferably about 70° C. In such lower temperature methods, a radical initiator such as AIBN may be added. For methods of the invention employing peroxide sources, preferably the contact with at least one surface of the wafer is maintained for a period of between about 1 and 60 minutes, more preferably between about 5 and 20 minutes.

In methods of the invention that employ peroxide sources, ozone may also be added to the supercritical solution. A description of the enhancing oxidative power of ozone when combined with peroxides is described in U.S. patent application Ser. No. 10/128,899 filed, Apr. 22, 2002, and titled "METHOD AND APPARATUS FOR REMOVING PHOTORESIST AND POST-ETCH RESIDUE FROM SEMICONDUCTOR SUBSTRATES BY IN SITU GENERATION OF OXIDIZING SPECIES," naming Tipton, et al. as the inventors, which is incorporated herein by reference for all purposes.

In other embodiments, the pH of the peroxide source is made basic to enhance the degradation of peroxide and its cleaning properties. Preferably the pH of a solution of the peroxide source is between about 10 and 11. A preferred base used to achieve this pH range is an ammonium hydroxide, preferably a tetraalkyl ammonium hydroxide. Other preferred examples include ammonium bicarbonates and ammonium carbonates such as tetraalkyl ammonium bicarbonates and carbonates. In one example, a base is added to the peroxide source in supercritical solvent just prior to entry into the supercritical process chamber. In a specific example, the supercritical cleaning solution includes an oxidant such as hydrogen peroxide with acetonitrile as a cosolvent and a tetra-alkyl ammonium bicarbonate or an ammonium carbonate to provide a basic solution.

In some embodiments, the supercritical solution further includes a chelating agent. For methods of the invention employing peroxide sources, preferably the chelating agent is selected from the group consisting of EDTA, acetyl acetone, hexafluoroacetyl acetone, catechol, biphenol, and dithiolcarbamate. In some embodiments, the supercritical solution further includes an anti-corrosion agent. For methods of the invention employing peroxide sources, preferably the anti-corrosion agent is selected from the group consisting of thiols, thiophenes, and gallic acid. In some embodiments, the supercritical solution further includes a surfactant that assists in removal of particles from at least one surface of the wafer. Examples of suitable surfactants for this purpose include amphiphilic fluoropolymers and siloxanes, poly carbonates and carbonate copolymers.

Apparatus for Cleaning with Supercritical Solutions

This invention is not limited to any particular apparatus. Generally, the apparatus will include a chamber (sometimes referred to as a process vessel) that houses one or more wafers during cleaning. The chamber must maintain the wafer in a defined position or positions (with or without motion within that position, e.g. rotation, vibration, or other agitation) during contact with the supercritical cleaning solution. The wafer may also be placed on a heating platen. Preferably, the cleaning solution flows over the wafer or is agitated in the chamber.

Generally, the cleaning solutions of this invention may be employed to clean wafers in any batch or continuous processing apparatus. However, one particularly preferred apparatus continuously recirculates supercritical cleaning solution through a process vessel housing one or more wafers during cleaning. This apparatus will be described generally below with reference to FIGS. 2A, 2B, 3A, and 3B. Further embodiments and more details can be found in U.S. patent application Ser. No. 10/067,520, previously incorporated by reference.

Figure 2A:
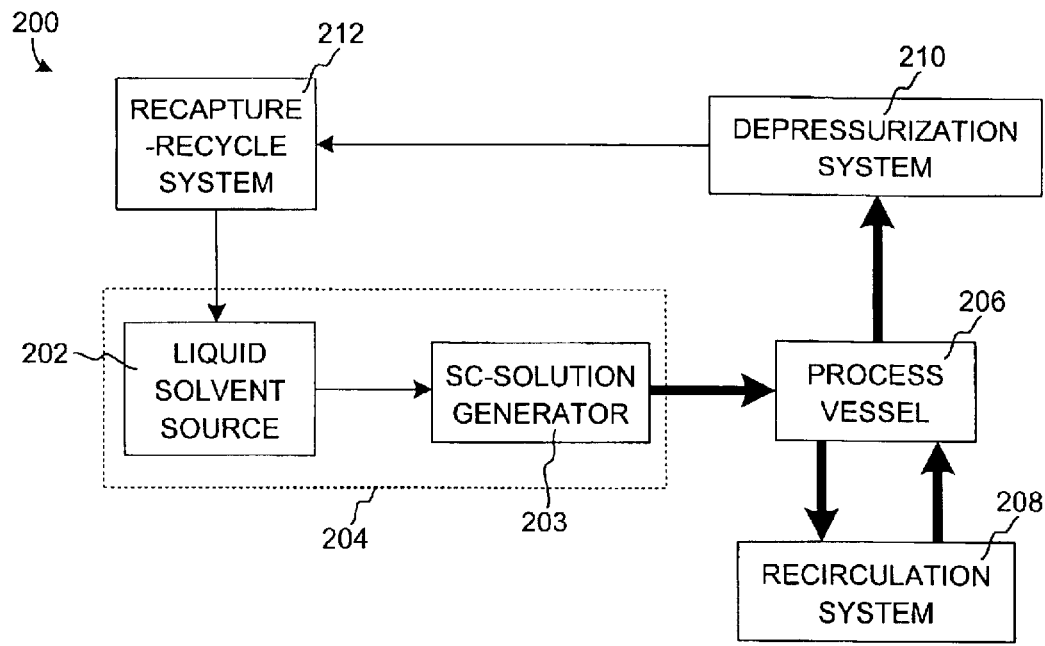
FIG. 2A is a block diagram of a sample wafer cleaning system that may be employed with this invention.

FIG. 2A shows a cleaning system 200 that may be used to clean wafers with supercritical solutions in accordance with an embodiment of this invention. Included in wafer cleaning system 200 are a solvent delivery mechanism 204 (bounded by the dotted line), a process vessel 206, a recirculation system 208, a depressurization system 210, and a recapture-recycle system 212. Solvent delivery mechanism 204 includes a liquid solvent source 202 and supercritical solution generator 203. Note that the heavy arrows in FIG. 2A depict regions where the solution exists in the supercritical state and the fine arrows depict regions the solution exists in the sub-critical state.

In a preferred embodiment, solvent delivery mechanism 204 receives a sub-critical liquid solvent (for example liquid carbon dioxide) and converts it to a supercritical fluid. The resulting fluid is delivered to process vessel 206. The supercritical fluid contacts a wafer or wafers held within process vessel 206. The supercritical fluid is then recirculated through process vessel 206 (and over the wafer or wafers) via recirculation system 208. After processing the wafers, the supercritical solution is vented via depressurization system 210. Sub-critical solvent exits system 210 and is recaptured and processed (preferably recycled) in recapture-recycle system 212. Purified solvents from system 212 are reintroduced into solvent delivery mechanism 204 in a sub-critical state.

Figure 2B:
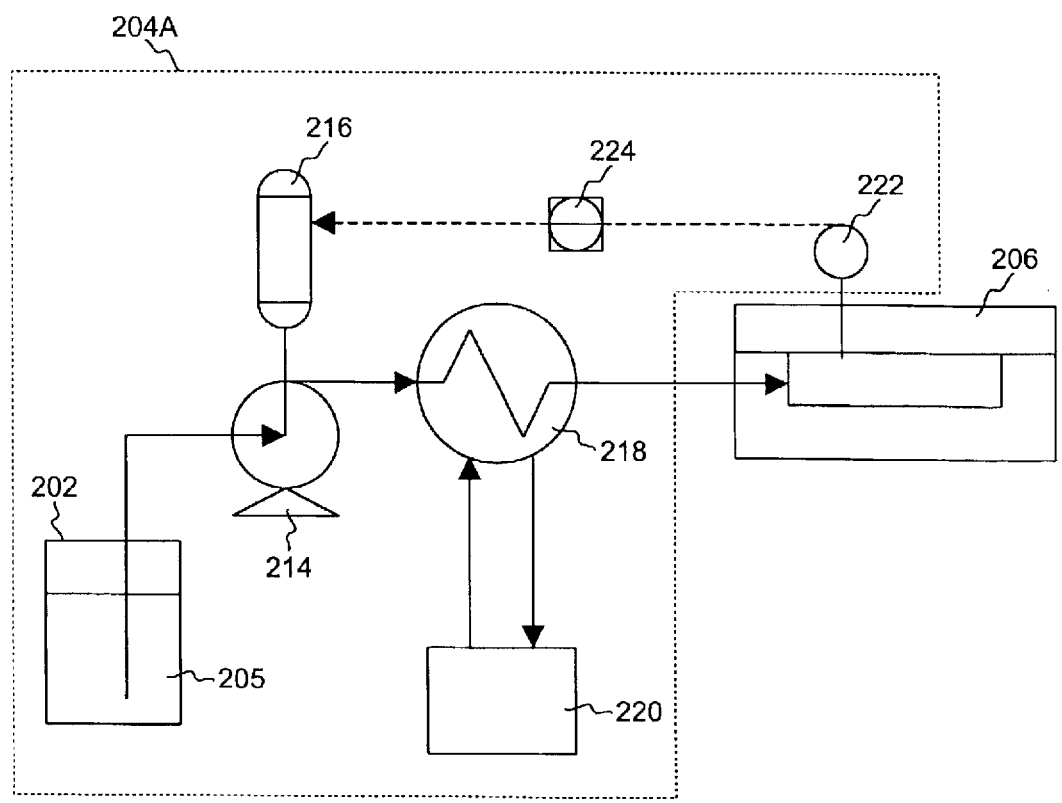
FIG. 2B is a schematic diagram of an apparatus for providing supercritical solvent or supercritical cleaning solution to a process vessel housing a wafer.

FIG. 2B shows one specific embodiment of solvent delivery mechanism 204 that may be employed with this invention. In this case, a solvent delivery mechanism 204A is depicted (within the dotted line area). Solvent delivery mechanism 204A includes a solvent source 202. Solvent source 202 in many cases is a dewar. Source 202 contains a sub-critical liquid solvent 205. Solvent 205 is delivered to a pump 214 (via an eductor tube). Pump 214 pressurizes solvent 205 and delivers it to a heat exchanger 218. Heat exchanger 218 receives heat from a heater 220. In this example, heater 220 provides heat to heat exchanger 218 via circulation of a heated fluid through the heat exchanger. Such heat exchangers, for this purpose include various forms such as parallel plate, shell and tube, coaxial coil, and the like. Alternatively, electrical resistance heaters may be imbedded directly in heat exchanger 218.

Pump 214 pressurizes sub-critical solvent 205, and the pressurized fluid is then heated by heat exchanger 218. The combination of pressurization by pump 214 and heating by heat exchanger moves the solvent into a supercritical state. Solvent 205 is maintained at a temperature well below its critical temperature. Pump 214 pressurizes solvent 205 to at least its critical pressure, thus creating a pressurized liquid. The critical pressure is the pressure at which the solvent would turn supercritical if it were at its critical temperature. In this case, since sub-critical solvent 205 is well below its critical temperature when it reaches pump 214, it does not reach a supercritical state within pump 214. The pressurized liquid is then delivered to heat exchanger 218, where it is heated to at least its critical temperature. This converts the pressurized fluid to a supercritical fluid for delivery to process vessel 206.

An advantage of solvent delivery mechanism 204A is that a liquid solvent is first pressurized and then heated to form a supercritical solution. This differs from conventional systems, in which a gas is compressed (via an internal compressor) and heated in order to create a supercritical solution, a much more energy intensive process.

Solvent delivery mechanism 204A delivers supercritical cleaning solution directly into process vessel 206. In this example, a pressure sensor 222 measures process vessel pressure. It provides this information to a pressure controller 224. Pressure controller 224 can be programmed to ramp pressure at a given rate. Once the desired process vessel pressure is achieved, pressure controller 224 controls the pressure of the system by use of a closed-loop algorithm such as a proportional integral derivative or PID. Such control is achieved by controlling the pumping rate of pump 214 via motor 216 to reach the target pressure. The invention is not limited to this feed back control mechanism, other control mechanisms may be employed. In an alternative embodiment, an intermediate buffer vessel is used to store the supercritical cleaning solution before delivery to the process vessel.

Figure 3A:
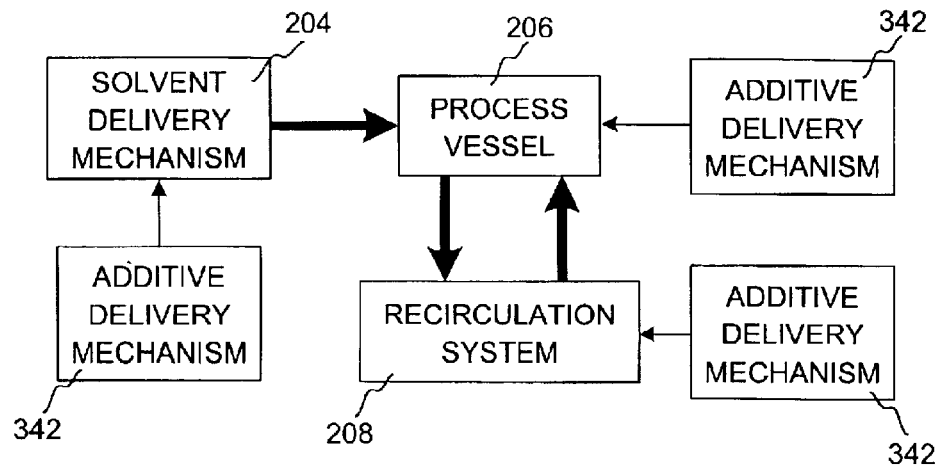
FIG. 3A is a block diagram showing locations of additives delivery mechanisms that may be used to deliver additives and thereby produce the supercritical solutions of this invention.

As depicted in FIG. 3A, an additive delivery mechanism 342 may add a chemical additive or additives to the cleaning solution at various locations of a wafer cleaning system. For example, additive delivery mechanism 342 can introduce a chemical additive directly to recirculation system 208. Alternatively, mechanism 342 may introduce a chemical additive directly to process vessel 206. Even further, an additive delivery mechanism 342 may introduce a chemical additive to solvent delivery mechanism 204 (to subcritical solvent in source 202 or in downstream a feed line containing the supercritical solvent). As indicated above, the additives may be preformed materials or precursors that are converted by in situ reaction to the desired compound. For example, tetramethyl ammonium hydroxide may be converted in situ to tetramethyl ammonium bicarbonate.

In preferred embodiments of the invention, the additive delivery mechanism 342 adds chemical additives directly to supercritical cleaning solution within these sub-systems. In a particularly preferred embodiment, the additive delivery mechanism adds a chemical additive to the recirculation system. As mentioned, solvent delivery mechanism 204 provides a supercritical cleaning solution to process vessel 206 and recirculation system 208. In some cases however, it can also provide a sub-critical cleaning solution to these components. Therefore, additive delivery mechanisms 342 may add chemical additives directly to a sub-critical liquid phase cleaning solution in any of components 204, 206, and 208.

Figure 3B:
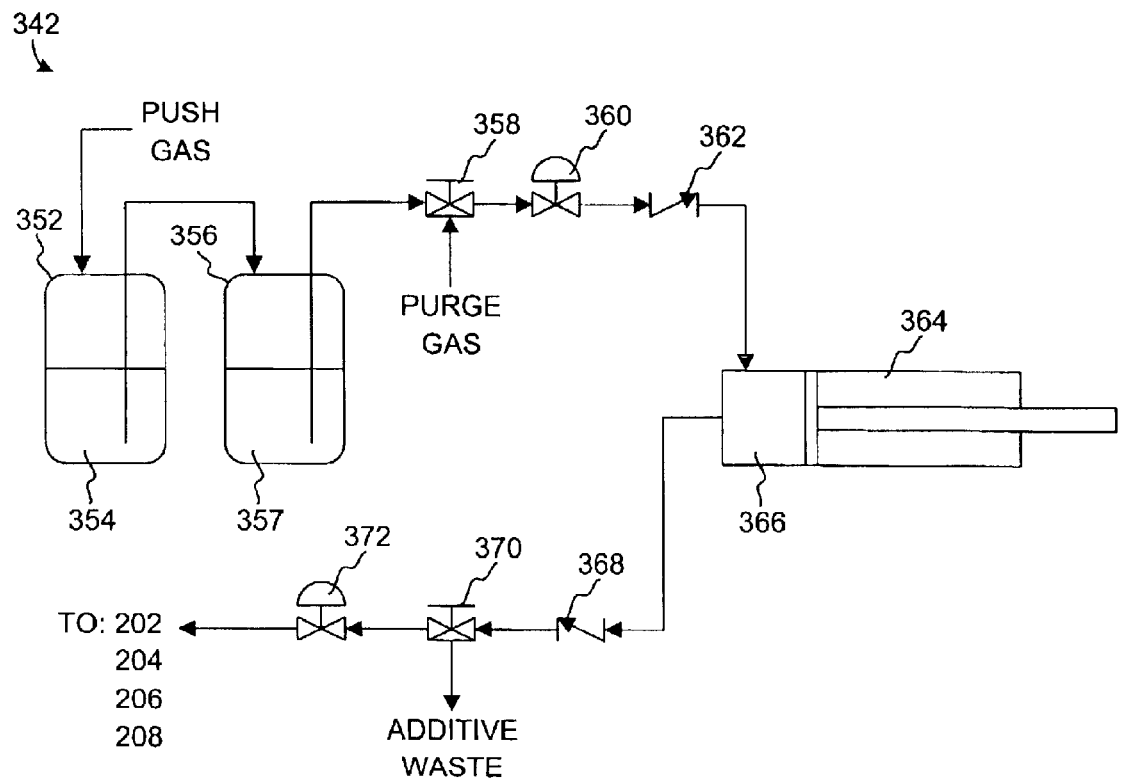
FIG. 3B is a block diagram of a simple additive delivery mechanism that may be used to produce the supercritical solutions of this invention.

FIG. 3B shows an example additive delivery mechanism 342 of the invention. In this example, additive delivery mechanism 342 includes a first ampoule 352, a second ampoule 356, a manually controlled valve 358, a control valve 360, a check valve 362, a syringe pump 364, a check valve 368, a manually controlled valve 370, and a control valve 372. In this example, additive delivery mechanism 342 is designed for the addition of liquid phase chemical additives. A solid phase chemical additive may be pre-dissolved into a solution and added via mechanism 342. Additionally, mechanism 342 may be used to introduce gaseous chemical additives into the wafer cleaning system of the invention. Preferably however, gaseous additives are liquified or dissolved in liquids before entering mechanism 342.

In this example, ampoule 152 holds a liquid chemical additive 154. A push gas is used to drive the liquid chemical additive through an eductor tube and into second ampoule 356. Second ampoule 356 is used as a degassing point for the liquid chemical additive. Thus, degassed liquid chemical additive 357 is pushed through an eductor tube and into valve 358. Three-way valve 358 allows introduction of purge gas into the system including syringe pump 364. This is done to remove any oxygen or unwanted gases from getting into supercritical cleaning solution. The liquid chemical additive traverses valve 358, 360, and 362 before entering volume 366 of syringe pump 364. Withdrawal of the barrel of the syringe pump draws the liquid chemical additive through the above-mentioned components and into volume 366. Valves 360 and 372 are controlled by flow controllers (not depicted) of the cleaning system. Check valve 362 is a one-way valve that prevents back flow through the additive delivery mechanism feed line. Once the desired amount of liquid additive is drawn into the syringe barrel, the syringe barrel is pushed inward, driving the liquid chemical additive out of volume 366 and through one-way valve 368, valve 370, and valve 372. As shown, the chemical additive can be added to sub-critical liquid solvent source 202, solvent delivery mechanism 204 (for example in lines supplying supercritical solution to the process vessel), process vessel 206, or recirculation system 208.

Three way valve 370 is used to divert chemical additives from entering components of the wafer cleaning system and route them into an appropriate waste stream. This is necessary because delivery mechanism 342 is a one-way flow system. Thus, valve 370 can be used to remove unwanted additives from syringe 364 as well as remove rinse solvents that are used to rinse the system to clean it of chemical additives.

Figure 4:
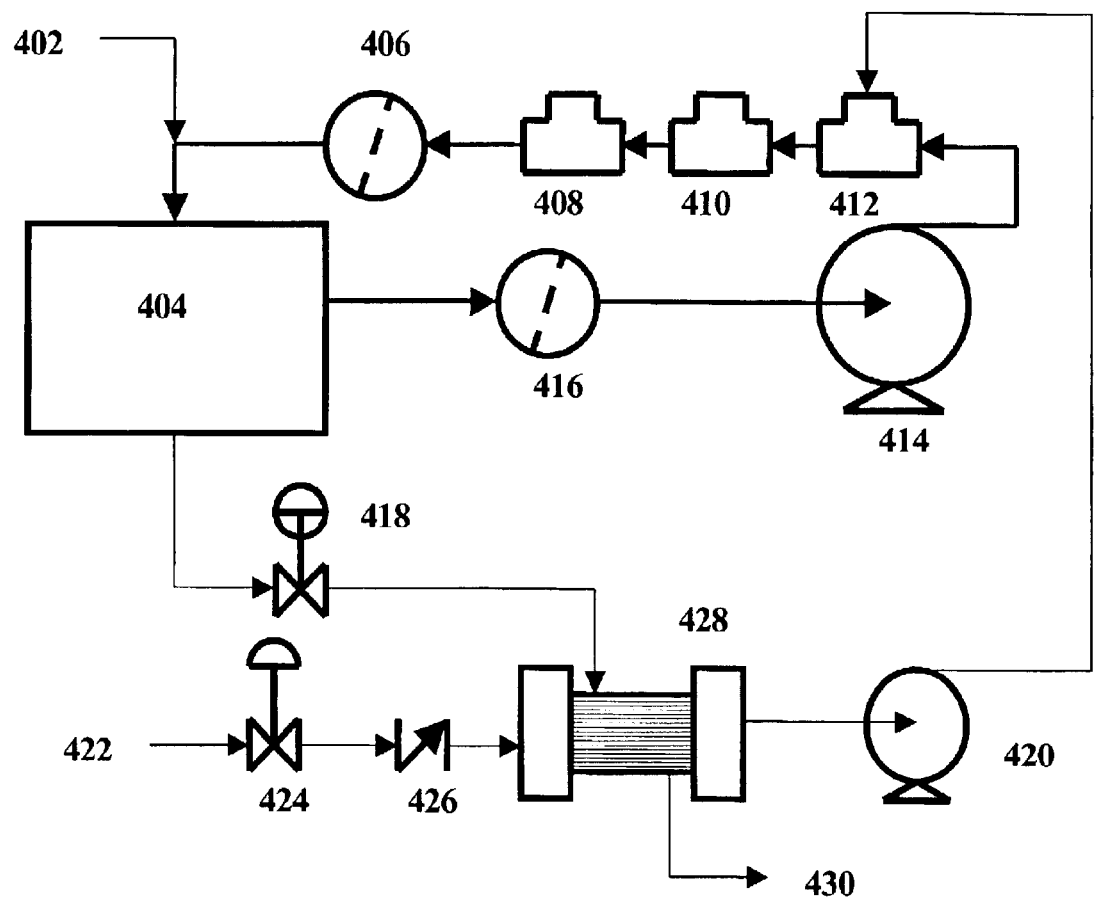
FIG. 4 is a block diagram of an additive delivery mechanism that may be employed for in situ conversion of ammonium hydroxides to ammonium bicarbonates and/or carbonates for use in supercritical solutions of this invention.

In cases where in situ conversion of ammonium hydroxide to carbonates and bicarbonates is desired, the chemical additive system may be modified by the addition of a contactor device necessary for said conversion. One example of such a system is shown in FIG. 4. This example shows a system wherein the chemical additive is modified in the subcritical regime prior to its mixing with the supercritical fluid. Fresh supercritical carbon dioxide 402 is introduced into a process chamber 404. A recirculation pump 414 transports this carbon dioxide through filters 406 and 416 and past chemical injection manifolds 408, 410, and 412. The recirculation loop presents a medium through which chemical additives may be introduced and mixed into the supercritical process fluid. It also establishes, via flow distributors, plenums and showerheads (not shown in FIG. 4) that are disposed within process chamber 404, an advantageous flow field over the substrate being processed.

An additive 422 containing an ammonium hydroxide (e.g., a tetra-alkyl ammonium hydroxide such as tetramethyl ammonium hydroxide in the preferred embodiment) dissolved in a suitable co-solvent such as an aliphatic alcohol (ethanol in the preferred embodiment) is conducted to a contactor device 428 via a shutoff valve 424 and a check valve 426. The contactor may take on the form of a membrane module. The membrane may be made from microporous material that is not wetted by the chemical additive, such as Teflon or polypropylene. Modules incorporating membranes in the form of hollow fiber bundles are available from a wide variety of commercial vendors and are fast gaining acceptance as reliable and efficient means for contacting two otherwise immiscible fluids. The additive 422 is caused to flow through the insides of these hollow fibers.

Carbon dioxide is vented from the process chamber 404 via the flow control valve 418. The flow control valve 418 also acts as a throttle reducing the pressure of this exiting fluid to a value substantially below the critical point. In one embodiment, the exhausted carbon dioxide containing dissolved additives is recycled by further processing in a purifier (not shown here). This exiting carbon dioxide is conducted on the outsides of the hollow fiber bundle inside the membrane contactor 428. The carbon dioxide is thus used to convert tetra-alkyl ammonium hydroxide contained in the chemical additive 422 into its carbonate or bicarbonate form. The presence of other co-solvents such as ethanol in the carbon dioxide exiting the chamber 404 prevents evaporation of the same co-solvent in the incoming additive stream. After the carbon dioxide has been contacted with the incoming additive, it is exhausted 430 to a purifier for recycling. The converted additive is conducted to its mixing manifold 412 by an additive pump 420. By employing the additive pump downstream of the contactor, the conversion of tetra-alkyl ammonium hydroxide to its carbonate or bicarbonate form may occur at a modest pressure. This permits operation of the membrane contactor 428 with a small pressure difference across the membrane, thus preserving mechanical integrity of the membrane material. The additive pump 420 is responsible for increasing pressure of the chemical additive 422 so that it may be mixed into the supercritical process fluid that is caused to be recirculated by the recirculation pump 414. Other chemical additives necessary for the particular process are added to the supercritical fluid via manifolds 408 and 410. The other additives may be introduced simultaneously with addition of the tetra-alkyl ammonium carbonate/bicarbonate or in sequence with it, either before or subsequent to the use of the latter. Other alternative contactors such as spray towers, packed beds, and bubblers are also envisioned in this invention.

As mentioned, chemical additives are introduced into the wafer cleaning system via the recirculation system, the process vessel, or the solvent delivery mechanism, when charged with supercritical cleaning solution. The wafer or wafers are cleaned using the supercritical cleaning solution and any additives. After processing of the wafer is complete, the mixture of chemical additive and cleaning fluid has to be removed from the system. Preferably, removal of the supercritical cleaning solution from the system is performed by first diluting the solution with pure supercritical carbon dioxide to remove at least a portion of the chemical additives. After the chemical additives have been removed or diluted sufficiently such that they will not precipitate out of the solvent when vented, then the system is vented. Thus, the system is held under supercritical conditions until the additive is removed or diluted to a desired degree, and then depressurized.

Other Embodiments

While this invention has been described in terms of a few preferred embodiments, it should not be limited to the specifics presented above. Many variations on the above-described preferred embodiments, may be employed. Therefore, the invention should be broadly interpreted with reference to the following claims.

What is claimed is:

1. A method of removing waste material from a semiconductor wafer, the method comprising:
   (a) receiving the semiconductor wafer in a chamber;
   (b) dissolving a reagent into a supercritical solvent to create a supercritical solution; and
   (c) providing the supercritical solution to the chamber to thereby contact at least one surface of the wafer and remove at least a portion of the waste material from the semiconductor wafer;
   wherein the reagent facilitates removal of the material, and wherein the reagent comprises at least one of an ammonium bicarbonate prepared ahead of time, prior to contact with the supercritical solvent, and an ammonium carbonate prepared ahead of time, prior to contact with the supercritical solvent.

2. The method of claim 1, wherein the supercritical solvent is supercritical carbon dioxide.

3. The method of claim 2, wherein the supercritical solution further comprises a co-solvent that increases the solubility of the reagent in the supercritical carbon dioxide.

4. The method of claim 3, wherein the co-solvent is selected from the group consisting of alcohols, ethers, alkyl halides, alkanes, alkenes, nitriles, amides, aromatic compounds, siloxanes, and combinations thereof.

5. The method of claim 1, wherein the waste material to be removed is selected from the group consisting of photoresists, residues, plasma residues, sputtered metals plasma residue or particles resulting from a wafer process, oxides, and combinations thereof.

6. The method of claim 1, wherein the reagent comprises a tetraalkyl ammonium carbonate or a tetraalkyl ammonium bicarbonate.

7. The method of claim 6, wherein (b) comprises adding the tetraalkyl ammonium bicarbonate or tetraalkyl ammonium carbonate, as a solution in a co-solvent, to the supercritical carbon dioxide in the presence of the semiconductor wafer.

8. The method of claim 7, wherein the co-solvent is an aliphatic alcohol.

9. The method of claim 8, wherein the tetraalkyl ammonium bicarbonate or tetraalkyl ammonium carbonate has a final concentration in the supercritical solution of between about 0.1 and 0.5% by weight.

10. The method of claim 6, wherein the tetraalkyl ammonium carbonate or the tetraalkyl ammonium bicarbonate has a final concentration in the supercritical solution of between about 0.1 and 0.5% by weight.

11. The method of claim 1, wherein the pressure within said chamber is between about 1500 and 5000 psi during (b).

12. The method of claim 1, wherein the temperature within said chamber is maintained at between about 50° C. and 150° C. during (b).

13. The method of claim 1, wherein the temperature within said chamber is maintained at about 70° C. during (b).

14. The method of claim 1, wherein said contact with at least one surface of the wafer is maintained for a period of between about 1 and 60 minutes.

15. The method of claim 1, wherein said contact with at least one surface of the wafer is maintained for a period of between about 5 and 20 minutes.

16. The method of claim 1, further comprising rinsing the semiconductor wafer with at least one of deionized water, an organic solvent, the supercritical solvent, and mixtures thereof after (b).

17. The method of claim 1, wherein the supercritical solution further comprises a chelating agent.

18. The method of claim 17, wherein the chelating agent is selected from the group consisting of EDTA, acetyl acetone, hexafluoroacetyl acetone, catechol, oxalic acid, and biphenol.

19. The method of claim 1, wherein the supercritical solution further comprises an anti-corrosion agent that protects one or more components of the wafer surface from corrosion.

20. The method of claim 19, wherein the anti-corrosion agent is selected from the group consisting of thiophenes, thiols, and gallic acid.

21. The method of claim 1, wherein the supercritical solution further comprises a surfactant that assists in removal of particles from the at least one surface of the wafer.

22. The method of claim 1, wherein the supercritical solution further comprises an oxidant.

23. The method of claim 22, wherein the oxidant is selected from the group consisting of peroxides and peracids.

24. The method of claim 23, wherein the oxidant is hydrogen peroxide.

25. The method of claim 22, wherein the supercritical solution further comprises acetonitrile as a co-solvent for the ammonium carbonate or bicarbonate, and wherein the ammonium carbonate or bicarbonate is a tetraalkylammonium carbonate or a tetraalkylammonium bicarbonate.

* * * * *